United States Patent
Chang et al.

(10) Patent No.: US 7,336,518 B2
(45) Date of Patent: Feb. 26, 2008

(54) LAYOUT FOR EQUALIZER AND DATA LINE SENSE AMPLIFIER EMPLOYED IN A HIGH SPEED MEMORY DEVICE

(75) Inventors: Soo-Bong Chang, Seoul (KR); Chi-Wook Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/383,727

(22) Filed: May 16, 2006

(65) Prior Publication Data

US 2007/0041256 A1   Feb. 22, 2007

(30) Foreign Application Priority Data

Aug. 17, 2005   (KR) .................. 10-2005-0075245

(51) Int. Cl.
*G11C 5/02* (2006.01)
(52) U.S. Cl. .................. 365/51; 365/72; 365/63; 365/202; 365/203; 365/190; 365/208; 365/207; 365/230.03
(58) Field of Classification Search ............... 365/202, 365/203, 230.03, 190, 205, 208, 207, 51, 365/72, 63
See application file for complete search history.

(56) References Cited

U.S. PATENT DOCUMENTS 6,459,627 B1 * 10/2002 Sakamoto et al. .......... 365/190
6,493,274 B2 * 12/2002 Ishikawa ................ 365/189.05
6,765,833 B2   7/2004 Khang ........................ 365/203
6,816,416 B2   11/2004 Won ....................... 365/189.02
7,154,796 B2 * 12/2006 Lee et al. .................... 365/203
2002/0159299 A1 * 10/2002 Ishikawa ................ 365/189.05
2006/0104102 A1 *  5/2006 Choi et al. ..................... 365/63

FOREIGN PATENT DOCUMENTS

JP          09-120674          5/1997

OTHER PUBLICATIONS

English language abstract of Japanese Publication No. 09-120674.

* cited by examiner

Primary Examiner—Andrew Q. Tran
(74) Attorney, Agent, or Firm—Marger Johnson & McCollom, P.C.

(57) ABSTRACT

A memory device includes a memory cell array block including memory cells, a word line driver block adjacent the memory cell array block disposed in a direction in which word lines of the memory cells are arranged, a sense amplifier block adjacent the memory cell array block disposed in a direction in which bit lines of the memory cells are arranged, a conjunction block disposed at an intersection of the word line driver block and the sense amplifier block, an equalizer for equalizing a pair of local data lines, the equalizer disposed in the conjunction block, and a local data line sense amplifier configured to sense and amplify signals on a pair of local data lines, and having transistors of a first type disposed in the conjunction block and transistors of a second type disposed in the sense amplifier block.

20 Claims, 9 Drawing Sheets

FIG. 11

LAYOUT FOR EQUALIZER AND DATA LINE SENSE AMPLIFIER EMPLOYED IN A HIGH SPEED MEMORY DEVICE

CROSS-REFERENCE TO RELATED PATENT APPLICATIONS

This application claims the benefit of Korean Patent Application No. 10-2005-0075245, filed on Aug. 17, 2005, in the Korean Intellectual Property Office, the disclosure of which is incorporated herein in its entirety by reference.

BACKGROUND OF THE INVENTION

1. Field of the Invention

This disclosure relates to a layout for a semiconductor memory device, and more particularly, to a layout for a PMOS-type equalizer and a differential amplifier type data line sense amplifier.

2. Description of the Related Art

Figure 1:
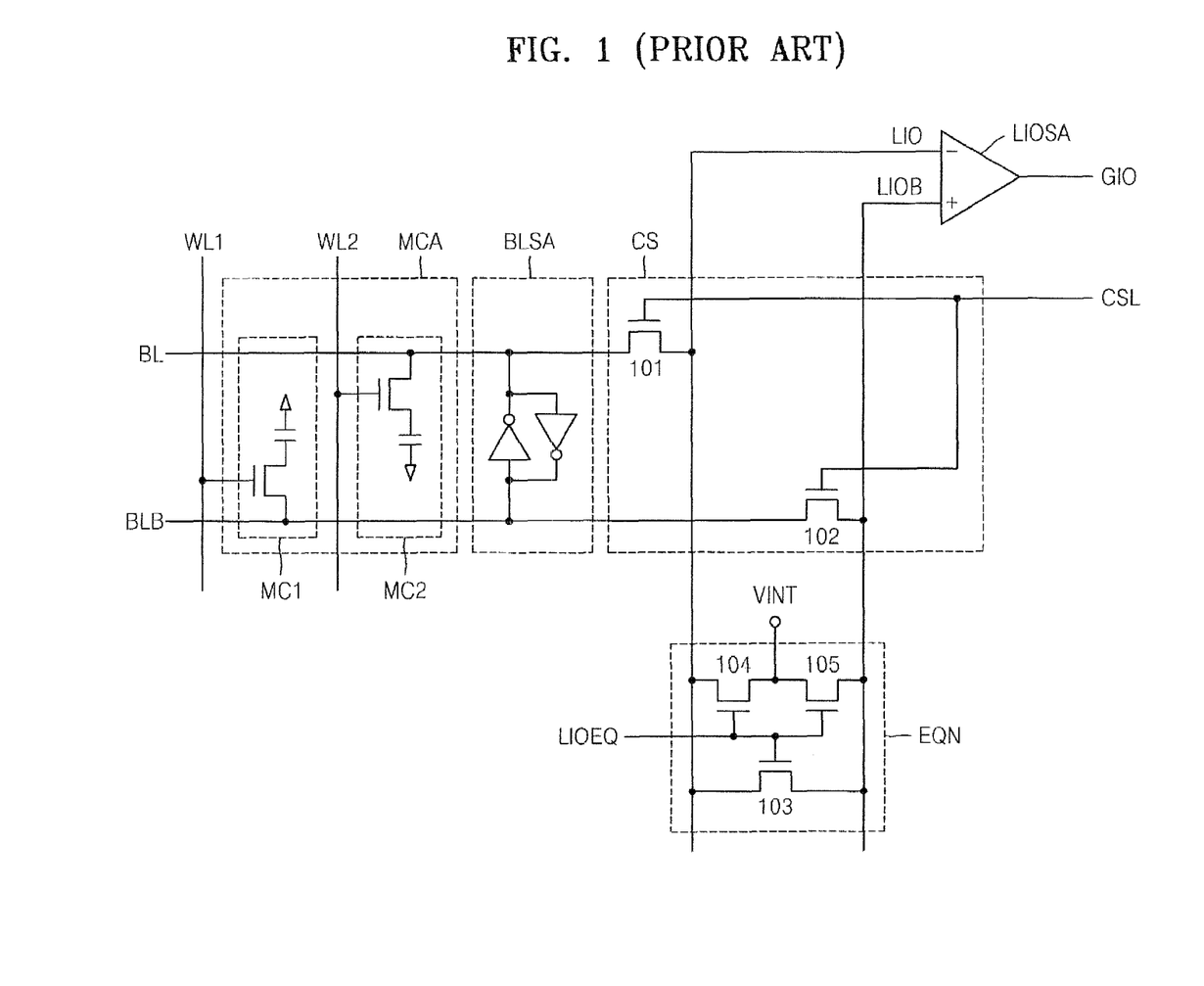
FIG. 1 is an internal circuit diagram of a conventional DRAM.

FIG. 1 is an internal circuit diagram of a conventional semiconductor memory device (for example, a DRAM).

Referring to FIG. 1, a pair of bit lines BL and BLB are coupled to a pair of local data lines LIO and LIOB through NMOS transistors 101 and 102. Memory cells MC1 and MC2, coupled to word lines WL1 and WL2 and bit lines BL and BLB are arranged in a memory cell array block MCA. The bit lines BL and BLB are coupled to a bit line sense amplifier BLSA which senses and amplifies data of the memory cells MC1 and MC2.

The bit lines BL and BLB are coupled to the local data lines LIO and LIOB through a column selector CS. The column selector CS is coupled to the bit lines BL and BLB and the local data lines LIO and LIOB. The column selector CS includes NMOS transistors 101 and 102 which are gated by a column selection signal CSL. An equalizer EQN for precharging and equalizing the local data lines LIO and LIOB to an internal supply voltage VINT is coupled between the local data lines LIO and LIOB. The equalizer EQN includes equalizing transistors 103, 104 and 105 which are coupled to the local data lines LIO and LIOB and gated by an equalizing signal LIOEQ. The local data lines LIO and LIOB are coupled to a local data sense amplifier LIOSA which senses and amplifies data transferred to the local data lines LIO and LIOB. The local data line sense amplifier LIOSA is illustrated in detail in FIG. 2.

Figure 2:
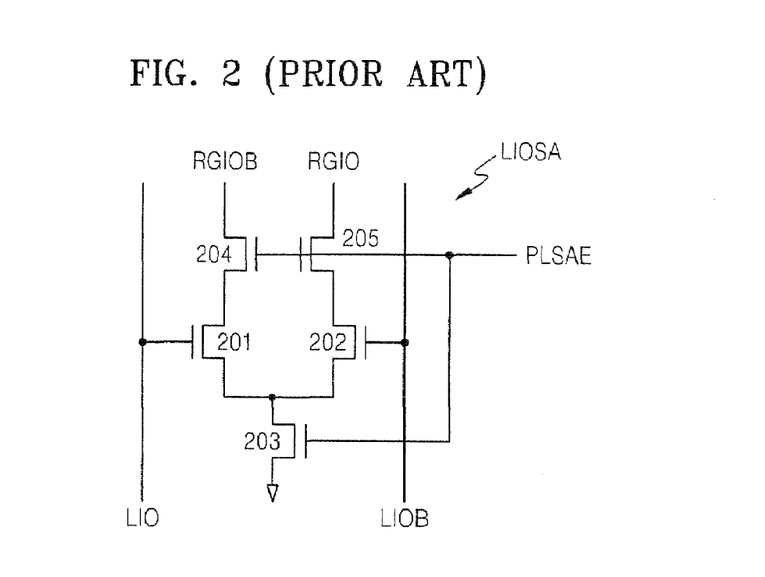
FIG. 2 is a circuit diagram of a NMOS type local data line sense amplifier illustrated in FIG. 1.

Referring to FIG. 2, the local data line sense amplifier LIOSA includes first and second NMOS transistors 201 and 202 which are gated by the local data lines LIO and LIOB, respectively, a third NMOS transistor 203 which is coupled between the drains of the first and second NMOS transistors 201 and 202 and a ground voltage VSS and which is gated by a sense amplifier enable signal PLSAE, and fourth and fifth NMOS transistors 204 and 205 which are respectively coupled to the drains of the first and second NMOS transistors 201 and 202 and which are gated by the sense amplifier enable signal PLSAE.

The local data line sense amplifier LIOSA transfers data of the local data line LIO to a read global data line RGIO and transfers data of the complementary local data line LIOB to a complementary global data line RGIOB, when the sense amplifier enable signal PLSAE goes "high."

Figure 3:
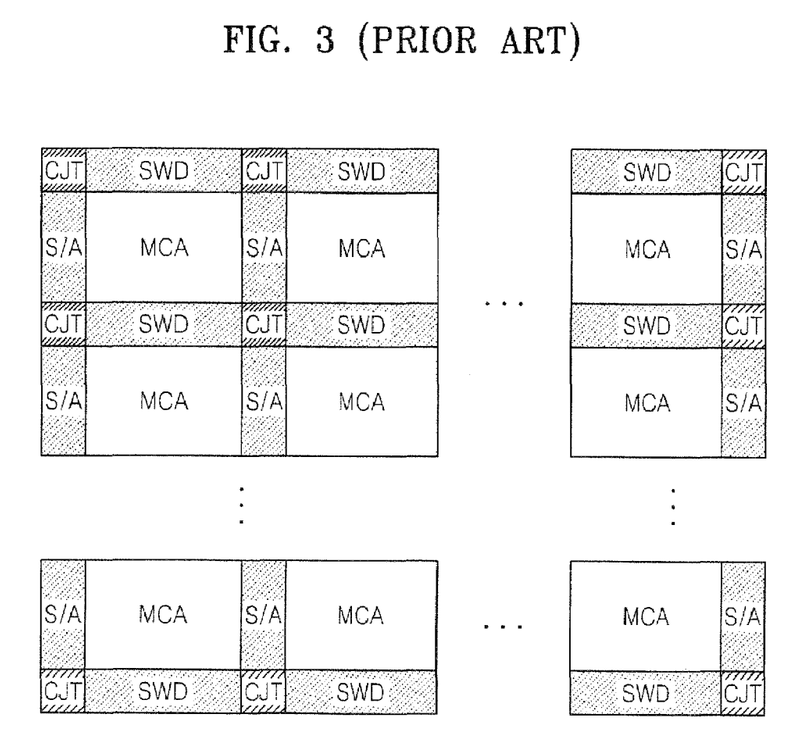
FIG. 3 illustrates a layout of a memory cell core area of the conventional DRAM.

FIG. 3 illustrates a general layout of a memory cell core area of a DRAM.

Referring to FIG. 3, memory cell array blocks MCA are arranged in the layout. Word line driver blocks SWD are aligned in a direction in which word lines of the memory cell array blocks MCA are arranged, and sense amplifier blocks S/A are aligned in a direction in which bit lines of the memory cell array blocks MCA are arranged.

Each sense amplifier block S/A includes bit line sense amplifiers BLSA. Conjunction blocks CJT are disposed at intersections of the word line driver blocks SWD and the sense amplifier blocks S/A. In each conjunction block CJT, power drivers for driving the bit line sense amplifiers BLSA and ground drivers are alternately arranged.

The equalizer EQN includes NMOS transistors 103, 104 and 105 (see FIG. 1), and the local data line sense amplifier LIOSA includes of NMOS transistors 201, 202, 203, 204 and 205 (see FIG. 2). The reason for implementing the equalizer EQN and the local data sense amplifier LIOSA with NMOS transistors 103, 104, 105, 201, 202, 203, 204 and 205 is so that the equalizer EQN and the local data sense amplifier LIOSA can be disposed in the sense amplifier block S/A in order to reduce the size of the memory cell core area.

If the equalizer EQN for precharging and equalizing the local data lines LIO and LIOB is implemented by NMOS transistors 103, 104 and 105, the local data lines LIO and LIOB can be completely precharged.

Figure 4:
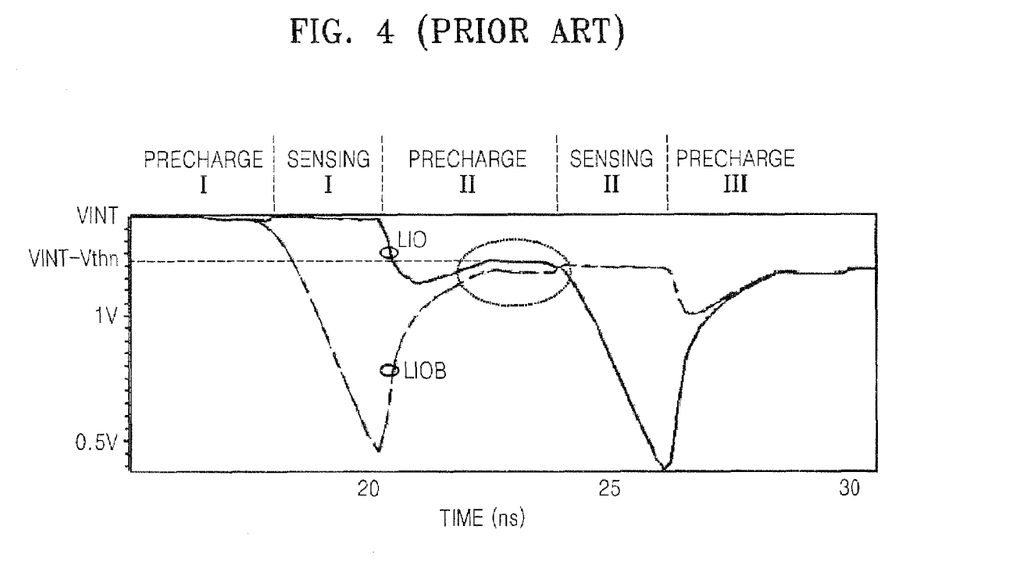
FIG. 4 shows a simulation result when local data lines are precharged using an NMOS-type equalizer illustrated in FIG. 1.

FIG. 4 illustrates a simulation result of precharging the local data lines LIO and LIOB using the NMOS type equalizer EQN.

Referring to FIG. 4, in a first precharge period I, when an equalizing signal LIO goes "high," the NMOS transistors 103, 104 and 105 are turned on, and the local data lines LIO and LIOB become VINT-Vthn when an internal supply voltage VINT falls by an amount corresponding to a threshold voltage Vthn of the NMOS transistors 104 and 105. As the first precharge period I is extended, the local data lines LIO and LIOB are precharged to the internal supply voltage level VINT due to a leakage current component of the NMOS transistors 104 and 105.

In a first sensing period I, memory cell data transferred to the local data lines LIO and LIOB is sensed.

Then, in a second precharge period II, the local data lines LIO and LIOB are precharged to the voltage VINT-Vthn. However, since the voltage of the local data line LIO sensed and amplified in the first sensing period I is similar to the voltage of VINT, the NMOS transistor 104 is not completely turned on. Accordingly, the local data line LIO cannot be precharged to the same voltage VINT-Vthn as that of the complementary local data line LIOB.

This is because the local data lines LIO and LIOB are precharged to the high internal supply voltage VINT by the NMOS transistors 104 and 105 of the equalizer EQN during the first precharge period I when the first sensing period I is started.

In a second sensing period II, the memory cell data transferred to the local data lines LIO and LIOB are sensed. Then, in a third precharge period III, the local data lines LIO and LIOB are precharged to the voltage VINT-Vthn.

SUMMARY OF THE INVENTION

An embodiment includes a memory device including a memory cell array block including memory cells, a word line driver block adjacent the memory cell array block disposed in a direction in which word lines of the memory cells are arranged, a sense amplifier block adjacent the memory cell array block disposed in a direction in which bit lines of the memory cells are arranged, a conjunction block disposed at an intersection of the word line driver block and the sense amplifier block, and an equalizer for equalizing a pair of local data lines, the equalizer disposed in the conjunction block.

Another embodiment includes a memory device including a memory cell array block including memory cells, a word line driver block adjacent the memory cell array block disposed in a direction in which word lines of the memory cells are arranged, a sense amplifier block adjacent the memory cell array block disposed in a direction in which bit lines of the memory cells are arranged, a conjunction block disposed at an intersection of the word line driver block and the sense amplifier block, and a local data line sense amplifier configured to sense and amplify signals on a pair of local data lines, and having transistors of a first type disposed in the conjunction block and transistors of a second type disposed in the sense amplifier block.

BRIEF DESCRIPTION OF THE DRAWINGS

The above and other features and advantages of the invention will become more apparent by describing embodiments in detail with reference to the attached drawings in which.

DETAILED DESCRIPTION OF THE INVENTION

Embodiments will now be described more fully with reference to the accompanying drawings, in which exemplary embodiments are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 5:
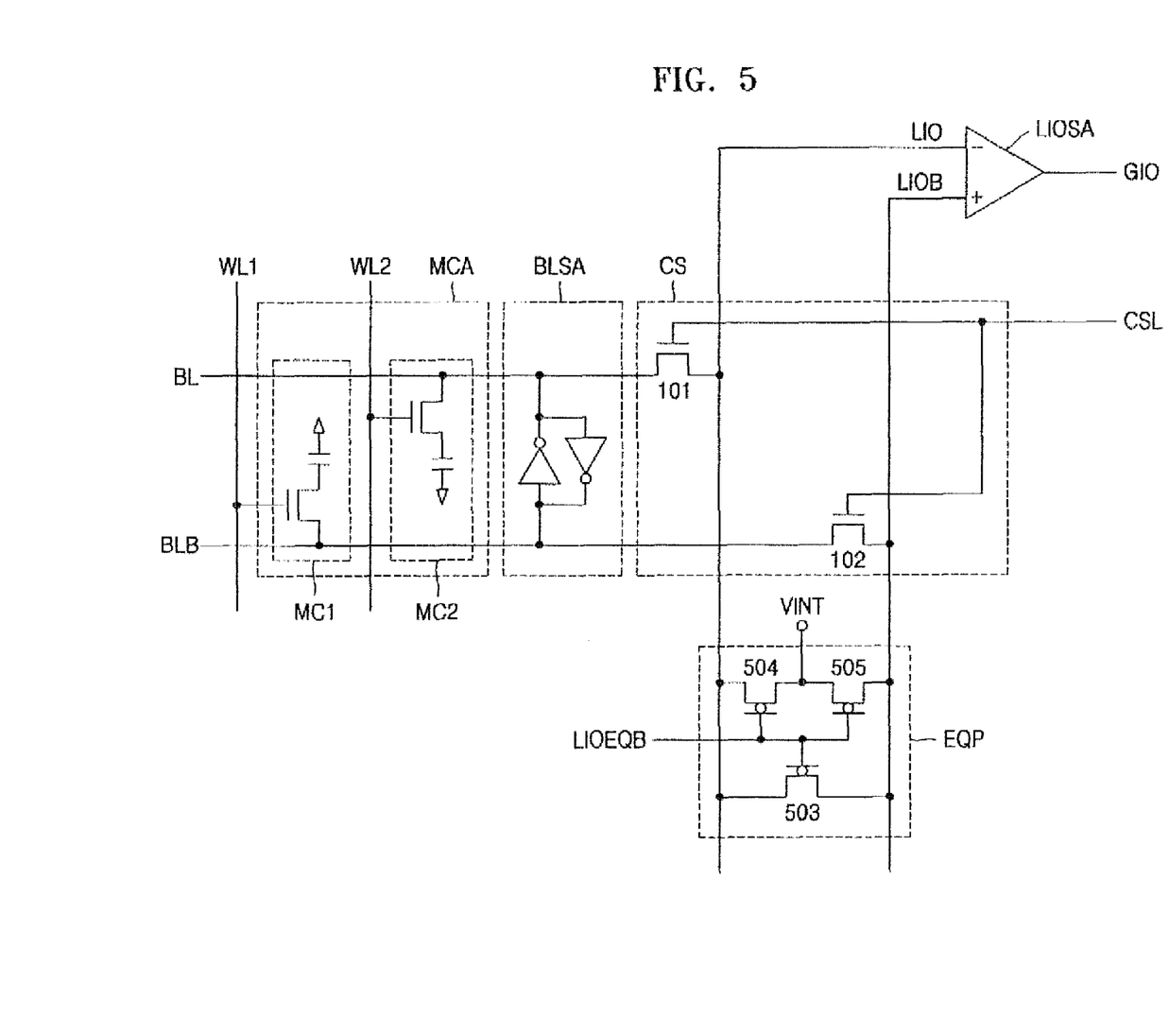
FIG. 5 is an internal circuit diagram of a DRAM including a PMOS-type equalizer according to a first embodiment.

FIG. 5 is an internal circuit diagram of a DRAM according to a first embodiment.

Referring to FIG. 5, the DRAM includes an equalizer EQP including of PMOS transistors 503, 504 and 505 disposed between local data lines LIO and LIOB. The PMOS transistors 503, 504 and 505 are coupled between the local data lines LIO and LIOB and gated in response to a complementary equalizing signal LIOEQB.

Figure 6:
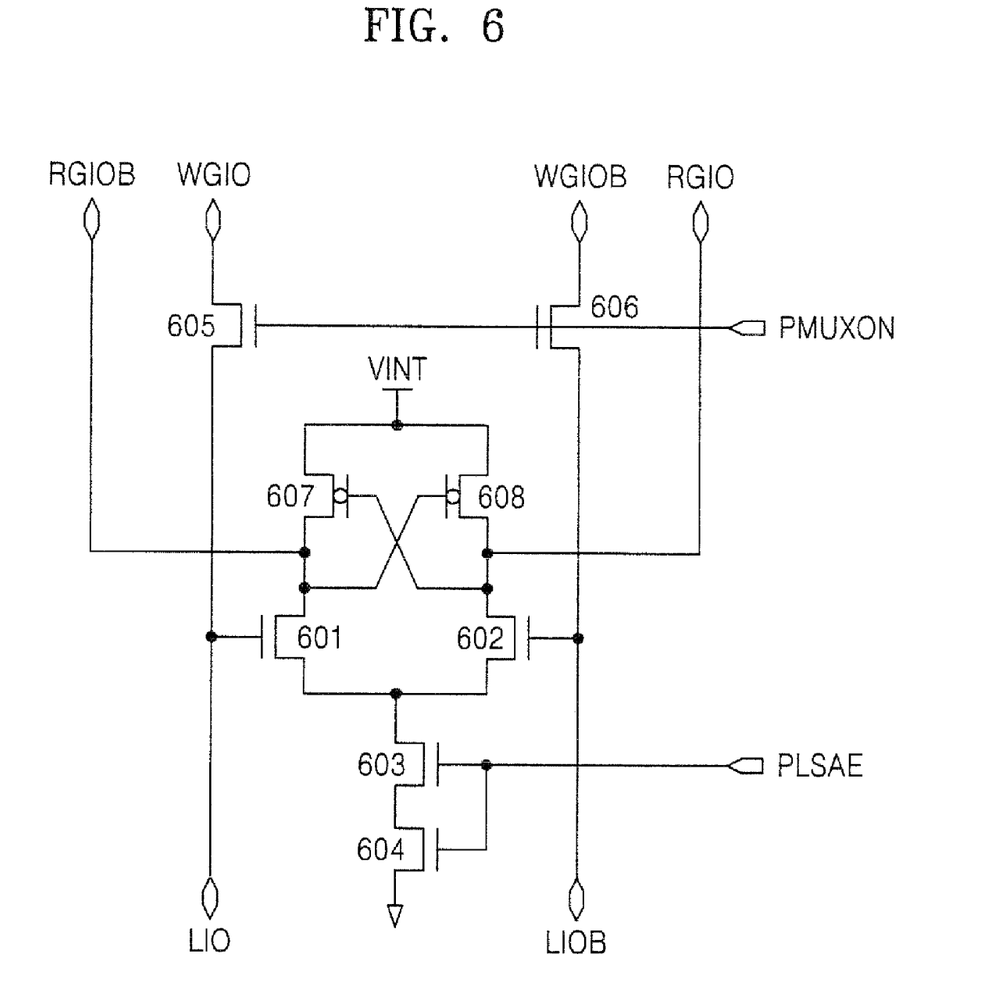
FIG. 6 is a circuit diagram of a differential amplifier type local data line sense amplifier according to a second embodiment.

FIG. 6 is a circuit diagram of a local data line sense amplifier LIOSA illustrated in FIG. 5 according to a second embodiment.

Referring to FIG. 6, the local data line sense amplifier LIOSA is a differential amplifier type local data line sense amplifier, and includes first through sixth NMOS transistors 601, 602, 603, 604, 605 and 606 and first and second PMOS transistors 607 and 608. The gates of the first and second NMOS transistors 601 and 602 are coupled to the local data lines LIO and LIOB. The sources of the first and second NMOS transistors 601 and 602 are coupled together. The third and fourth NMOS transistors 603 and 604 are coupled in series between the sources of the first and second NMOS transistors 601 and 602 and a ground voltage VSS. The gates of the third and fourth NMOS transistors 603 and 604 are coupled to a sense amplifier enable signal PLSAE. The fifth and sixth NMOS transistors 605 and 606 are respectively coupled to the local data lines LIO and LIOB, and gated in response to a write MUX signal PMUXON. The first and second PMOS transistors 607 and 608 are coupled between the drains of the first and second NMOS transistors 601 and 602, respectively, and an internal supply voltage VINT, and the gates of the first and second PMOS transistors 607 and 608 are coupled to the drains of the first and second NMOS transistors 602 and 601, respectively.

In a write operation, if the write MUX signal PMUXON goes "high," the fifth and sixth NMOS transistors 605 and 606 are turned on. Accordingly, write data transferred to the write global data lines WGIO and WGIOB are transferred to the local data lines LIO and LIOB.

In a read operation, if the sense amplifier enable signal PLSAE goes "high," data of the local data lines LIO and LIOB is sensed and amplified by the first through fourth NMOS transistors 601, 602, 603 and 604 and the first and second PMOS transistors 607 and 608, and is then transferred to read global data lines RGIO and RGIOB.

Figure 7:
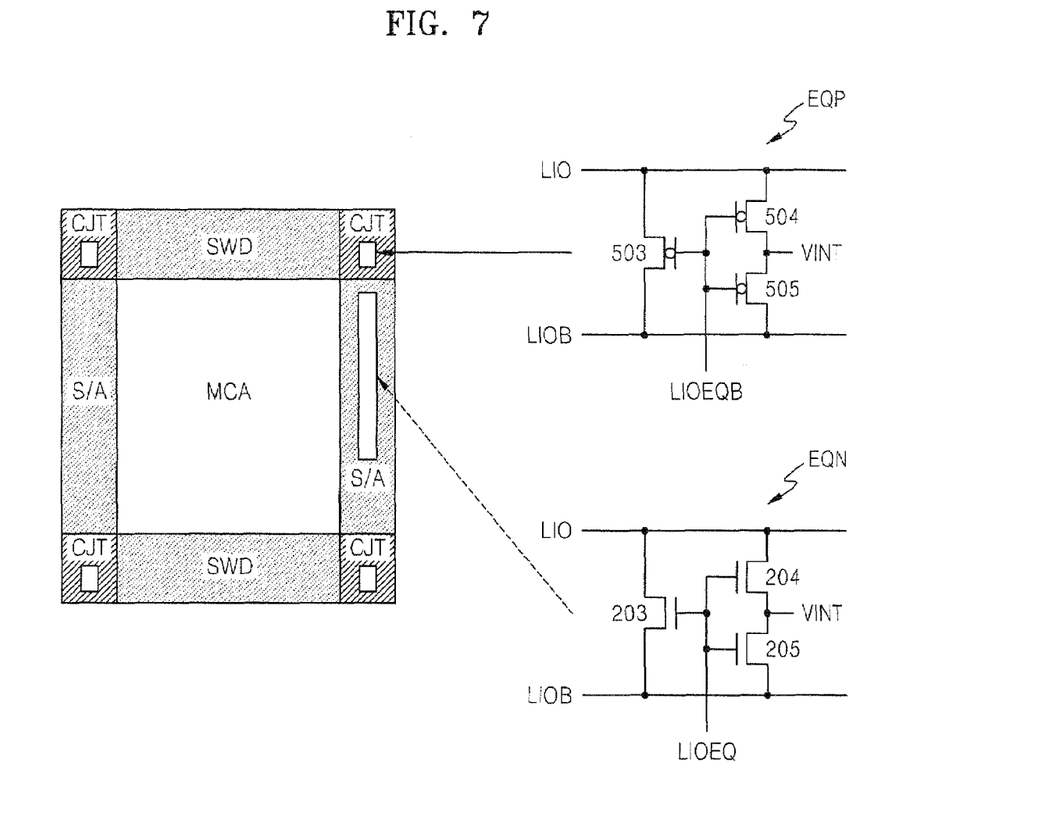
FIG. 7 is a view for explaining a layout method of disposing a PMOS-type equalizer according to a third embodiment.

FIG. 7 is a view for explaining a layout of a first NMOS-type equalizer EQN such as the one shown in FIG. 2 and a second PMOS-type equalizer EQP such as the one shown in FIG. 5, according to a third embodiment of the present invention.

Referring to FIG. 7, in the memory cell core area illustrated in FIG. 3, the first NMOS-type equalizer EQN including NMOS transistors 203, 204 and 205 is disposed in a sense amplifier block S/A, as in the conventional technique. The second PMOS-type equalizer EQP including PMOS transistors 503, 504 and 505 is disposed in a conjunction block CJT.

Since the second PMOS-type equalizer EQP is disposed in the existing conjunction block CJT even when the second PMOS-type equalizer EQP is newly disposed in the memory cell core area, a separate chip area for the second PMOS-type equalizer EQP is not required. Accordingly, the layout of the second PMOS-type equalizer EQP does not increase the size of the memory chip.

Figure 8:
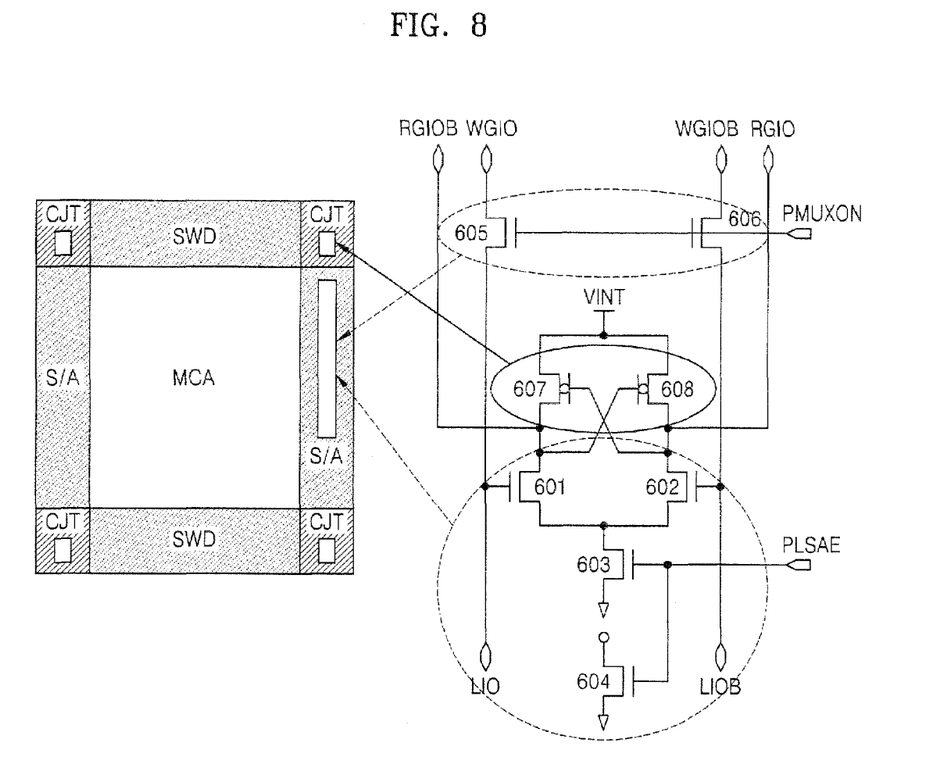
FIG. 8 is a view for explaining a layout method of disposing a differential amplifier type local data line sense amplifier according to a fourth embodiment.

FIG. 8 is a view for explaining a layout of a differential amplifier type local data line sense amplifier LIOSA illustrated in FIG. 4, according to a fourth embodiment.

Referring to FIG. 8, in the memory cell core area illustrated in FIG. 3, NMOS transistors 601, 602, 603, 604, 605 and 606 of the local data line sense amplifier LIOSA are disposed in a sense amplifier block S/A, and PMOS transistors 607 and 608 of the local data line sense amplifier LIOSA are disposed in a conjunction block CJT. Since the PMOS transistors 607 and 608 are disposed in an existing conjunction block CJT, a separate chip area for the PMOS transistors 607 and 608 is not required. Accordingly, the layout of the differential amplifier type local data line sense amplifier LIOSA does not increase the size of the memory chip.

Figure 9:
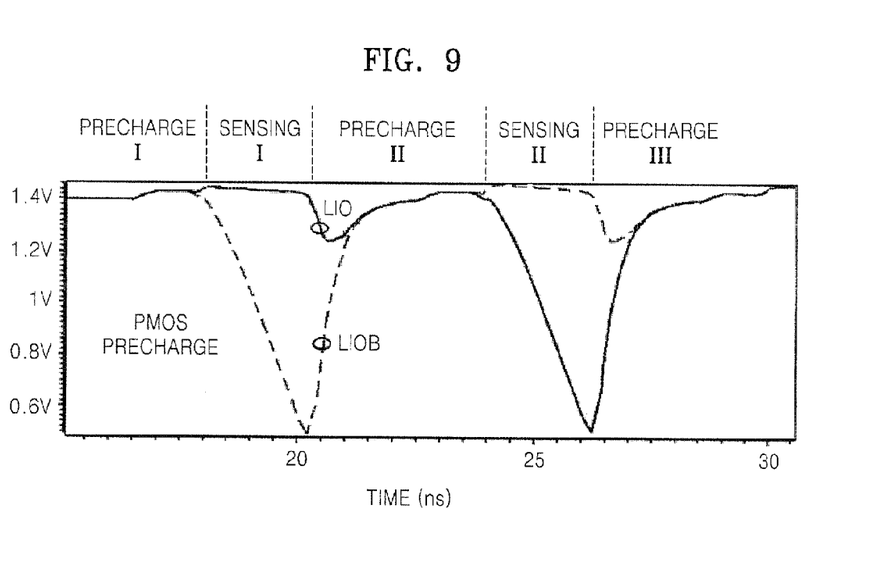
FIG. 9 shows a simulation result when local data lines are precharged using the PMOS-type equalizer according to the third embodiment.

FIG. 9 shows a simulation result when the local data lines LIO and LIOB are precharged using the second PMOS-type equalizer EQP illustrated in FIG. 5.

Referring to FIG. 9, in all of a first precharge period PRECHARGE I, a second precharge period PRECHARGE II, and a third precharge period PRECHARGE III, the local data lines LIO and LIOB are equally precharged to the same voltage, i.e., to an internal supply voltage VINT (for example, approximately 1.5 V).

Figure 10:
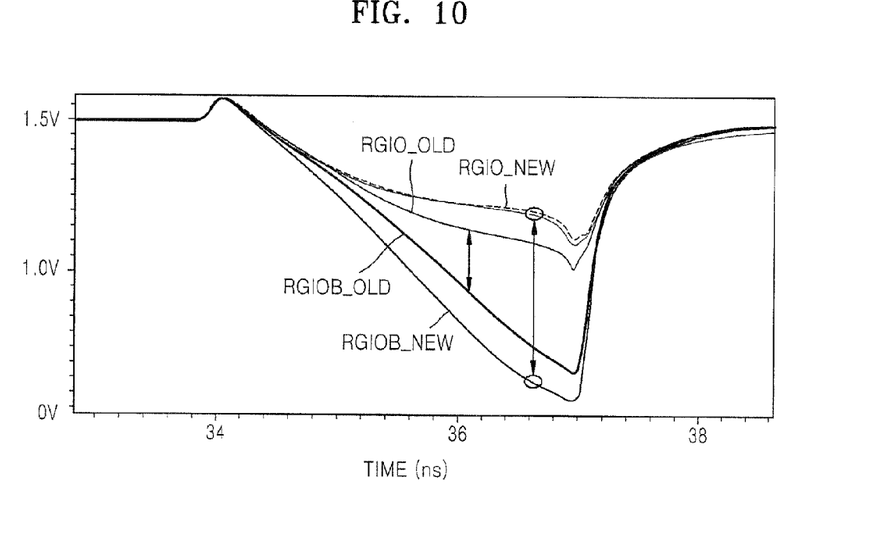
FIG. 10 shows simulation results of data access times tAA when the NMOS-type equalizer and the PMOS-type equalizer are respectively used.

FIG. 10 shows simulation results of data access times tAA when the first NMOS-type equalizer EQN and the second PMOS-type equalizer EQP, respectively, are used.

Referring to FIG. 10, a data access time tAA is 2.39 ns when the first NMOS-type equalizer EQN is used, while a data access time tAA is 2.15 ns when the second PMOS equalizer EQP is used. That is, a data access time tAA of when the second PMOS-type equalizer EQP is used, is shorter by approximately 250 ps than that of when the first NMOS-type equalizer EQN is used.

Figure 11:
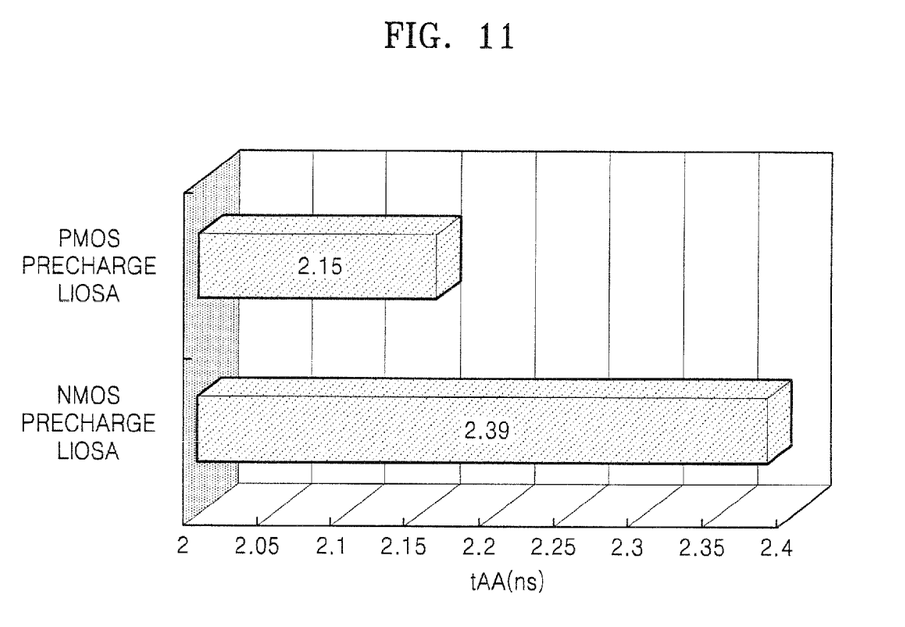
FIG. 11 shows a simulation result when data of local data lines are sensed and amplified using an NMOS-type local data line sense amplifier and the differential amplifier type local data line sense amplifier.

FIG. 11 shows a simulation result when data of the local data lines LIO and LIOB is sensed and amplified using the local data line sense amplifier LIOSA illustrated in FIG. 2 and the local data line sense amplifier LIOSA illustrated in FIG. 6.

Referring to FIG. 11, due to the differential amplifier type local data line sense amplifier illustrated in FIG. 6, a voltage difference between the read global data lines RGIO_NEW and RGIOB_NEW is significantly greater than a voltage difference between read global data lines RGIO_OLD and RGIOB_OLD generated by a conventional NMOS-type local data line sense amplifier illustrated in FIG. 2. This means that the sensing speed of the differential amplifier type local data line sense amplifier illustrated in FIG. 6 is higher than the sensing speed of the NMOS-type local data line sense amplifier illustrated in FIG. 2.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A memory device comprising:
   a memory cell array block including a plurality of memory cells;
   a word line driver block adjacent the memory cell array block, disposed in a direction in which word lines of the memory cells are arranged;
   a sense amplifier block adjacent the memory cell array block, disposed in a direction in which bit lines of the memory cells are arranged;
   a conjunction block disposed at an intersection of the word line driver block and the sense amplifier block; and
   an equalizer for equalizing a pair of local data lines, the equalizer having transistors of a first type disposed in the conjunction block, and transistors of a second type disposed in the sense amplifier block.

2. The memory device of claim 1, wherein the equalizer includes a PMOS-type equalizer.

3. The memory device of claim 1, wherein the equalizer comprises:
   a first PMOS transistor coupled between a first local data line and a second local data line of the pair of local data lines, and having a gate configured to receive a complementary equalizing signal;
   a second PMOS transistor having a source coupled to an internal power supply, a drain coupled to the first local data line, and a gate configured to receive the complementary equalizing signal; and
   a third PMOS transistor having a source coupled to the internal power supply, a drain coupled to the second local data line, and a gate configured to receive the complementary equalizing signal.

4. The memory device of claim 1, wherein the equalizer comprises an NMOS-type equalizer for equalizing the pair of the local data lines, the NMOS-type equalizer disposed in the sense amplifier block.

5. The memory device of claim 4, wherein the NMOS-type equalizer comprises:
   a first NMOS transistor coupled between a first local data line and a second local data line of the pair of local data lines, and having a gate configured to receive an equalizing signal;
   a second NMOS transistor having a source coupled to an internal power supply, a drain coupled to the first local data line, and a gate configured to receive the equalizing signal; and
   a third NMOS transistor having a source coupled to the internal power supply, a drain coupled to the second local data line, and a gate configured to receive the equalizing signal.

6. The memory device of claim 1, further comprising a column selection circuit including:
   a first NMOS transistor disposed in the sense amplifier block, coupled between a first bit line and a first local data line of the pair of local data lines, and having a gate configured to receive a column selection signal; and
   a second NMOS transistor disposed in the sense amplifier block, coupled between a second bit line and a second local data line of the pair of local data lines, and having a gate configured to receive the column selection signal.

7. The memory device of claim 1, further comprising:
   a plurality of power source drivers disposed in the conjunction block and configured to supply power to bit line sense amplifiers; and
   a plurality of ground drivers disposed in the conjunction block and configured to supply ground to bit line sense amplifiers.

8. A memory device, comprising:
   a memory cell array block including a plurality of memory cells;
   a word line driver block adjacent the memory cell array block, disposed in a direction in which word lines of the memory cells are arranged;
   a sense amplifier block adjacent the memory cell array block, disposed in a direction in which bit lines of the memory cells are arranged;

a conjunction block disposed at an intersection of the word line driver block and the sense amplifier block; and a local data line sense amplifier configured to sense and amplify signals on a pair of local data lines, and having transistors of a first type disposed in the conjunction block and transistors of a second type disposed in the sense amplifier block.

9. The memory device of claim 8, wherein the transistors of the first type are PMOS transistors, and the transistors of the second type are NMOS transistors.

10. The memory device of claim 8, wherein the local data line sense amplifier comprises:
a first NMOS transistor having a gate coupled to a first local data line of the pair of local data lines;
a second NMOS transistor having a gate coupled to a second local data line of the pair of local data lines, and a source coupled to a source of the first NMOS transistor;
a third NMOS transistor and fourth NMOS transistor coupled in series between the sources of the first and second NMOS transistors and a ground potential, each of the third and fourth NMOS transistors having a gate configured to receive a sense amplifier enable signal;
a fifth NMOS transistor having a source coupled to the first local data line and a gate configured to receive a write multiplex signal;
a sixth NMOS transistor having a source coupled to the second local data line and a gate configured to receive the write multiplex signal;
a first PMOS transistor coupled between a drain of the first NMOS transistor and an internal power supply, and having a gate coupled to a drain of the second NMOS transistor; and
a second PMOS transistor coupled between the drain of the second NMOS transistor and the internal power supply, and having a gate coupled to the drain of the first NMOS transistor.

11. The memory device of claim 8, further comprising a column selection circuit including:
a first NMOS transistor disposed in the sense amplifier block, coupled between a first bit line and a first local data line of the pair of local data lines, and having a gate configured to receive a column selection signal; and
a second NMOS transistor disposed in the sense amplifier block, coupled between a second bit line and a second local data line of the pair of local data lines, and having a gate configured to receive the column selection signal.

12. The memory device of claim 8, further comprising:
a plurality of power source drivers disposed in the conjunction block and configured to supply power to bit line sense amplifiers; and
a plurality of ground drivers disposed in the conjunction block and configured to supply ground to bit line sense amplifiers.

13. A memory device comprising:
a memory cell array block including a plurality of memory cells;
a word line driver block adjacent the memory cell array block, disposed in a direction in which word lines of the memory cells are arranged;
a sense amplifier block adjacent the memory cell array block, disposed in a direction in which bit lines of the memory cells are arranged;
a conjunction block disposed at an intersection of the word line driver block and the sense amplifier block;
an equalizer for equalizing a pair of local data lines, the equalizer disposed in the conjunction block; and
a local data line sense amplifier configured to sense and amplify signals on the pair of local data lines, and having transistors of a first type disposed in the conjunction block and transistors of a second type disposed in the sense amplifier block.

14. The memory device of claim 13, wherein the equalizer is a PMOS-type equalizer, the transistors of the first type are PMOS transistors, and the transistors of the second type are NMOS transistors.

15. The memory device of claim 13, wherein the equalizer comprises:
a first PMOS transistor coupled between a first local data line and a second local data line of the pair of local data lines, and having a gate configured to receive a complementary equalizing signal;
a second PMOS transistor having a source coupled to an internal power supply, a drain coupled to the first local data line, and a gate configured to receive the complementary equalizing signal; and
a third PMOS transistor having a source coupled to the internal power supply, a drain coupled to the second local data line, and a gate configured to receive the complementary equalizing signal.

16. The memory device of claim 13, further comprising an NMOS-type equalizer for equalizing the pair of the local data lines, the NMOS-type equalizer disposed in the sense amplifier block.

17. The memory device of claim 16, wherein the NMOS-type equalizer comprises:
a first NMOS transistor coupled between a first local data line and a second local data line of the pair of local data lines, and having a gate configured to receive an equalizing signal;
a second NMOS transistor having a source coupled to an internal power supply, a drain coupled to the first local data line, and a gate configured to receive the equalizing signal; and
a third NMOS transistor having a source coupled to the internal power supply, a drain coupled to the second local data line, and a gate configured to receive the equalizing signal.

18. The memory device of claim 13, wherein the local data line sense amplifier comprises:
a first NMOS transistor having a gate coupled to a first local data line of the pair of local data lines;
a second NMOS transistor having a gate coupled to a second local data line of the pair of local data lines, and a source coupled to a source of the first NMOS transistor;
a third NMOS transistor and fourth NMOS transistor coupled in series between the sources of the first and second NMOS transistors and a ground potential, each of the third and fourth NMOS transistors having a gate configured to receive a sense amplifier enable signal;
a fifth NMOS transistor having a source coupled to the first local data line and a gate configured to receive a write multiplex signal;
a sixth NMOS transistor having a source coupled to the second local data line and a gate configured to receive the write multiplex signal;

a first PMOS transistor coupled between a drain of the first NMOS transistor and an internal power supply, and having a gate coupled to a drain of the second NMOS transistor; and a second PMOS transistor coupled between the drain of the second NMOS transistor and the internal power supply, and having a gate coupled to the drain of the first NMOS transistor.

19. The memory device of claim 13, further comprising a column selection circuit including:

a first NMOS transistor disposed in the sense amplifier block, coupled between a first bit line and a first local data line of the pair of local data lines, and having a gate configured to receive a column selection signal; and a second NMOS transistor disposed in the sense amplifier block, coupled between a second bit line and a second local data line of the pair of local data lines, and having a gate configured to receive the column selection signal.

20. The memory device of claim 13, further comprising:

a plurality of power source drivers disposed in the conjunction block and configured to supply power to bit line sense amplifiers; and a plurality of ground drivers disposed in the conjunction block and configured to supply ground to bit line sense amplifiers.

* * * * *